(12) United States Patent
Zhou et al.

(10) Patent No.: US 7,754,982 B2
(45) Date of Patent: Jul. 13, 2010

(54) LOCKING SYSTEM FOR ELECTRONIC DEVICE HOUSING

(75) Inventors: Jian-Chu Zhou, Guangdong (CN); Hsieh-Tung Chung, Taipei Hsien (TW)

(73) Assignees: Premier Image Technology (China) Ltd., Foshan, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 142 days.

(21) Appl. No.: 12/191,283

(22) Filed: Aug. 13, 2008

(65) Prior Publication Data

US 2009/0211804 A1 Aug. 27, 2009

(30) Foreign Application Priority Data

Feb. 26, 2008 (CN) .......................... 200810300400

(51) Int. Cl.
*H05K 7/14* (2006.01)
*G03B 21/14* (2006.01)
(52) U.S. Cl. ................. 174/542; 174/563; 353/119; 361/759
(58) Field of Classification Search ............ 174/563, 174/561, 542; 348/744; 353/119; 361/759
See application file for complete search history.

(56) References Cited

U.S. PATENT DOCUMENTS

| 7,108,382 | B2 * | 9/2006 | Oross | ........................ 353/119 |
|---|---|---|---|---|
| 7,152,440 | B1 * | 12/2006 | Austin | ........................... 70/58 |
| 2002/0001472 | A1 * | 1/2002 | Ohmura et al. | ............. 396/429 |
| 2002/0109822 | A1 * | 8/2002 | Matsuda et al. | ............. 353/119 |
| 2005/0007559 | A1 * | 1/2005 | Oross | .......................... 353/81 |
| 2005/0030494 | A1 * | 2/2005 | Kumai | ....................... 353/119 |
| 2007/0024820 | A1 * | 2/2007 | Chung | ......................... 353/70 |
| 2007/0201005 | A1 * | 8/2007 | Rhodes et al. | ................. 353/30 |
| 2007/0258016 | A1 * | 11/2007 | Galligan et al. | ............. 348/744 |
| 2009/0073323 | A1 * | 3/2009 | Inoue | ........................ 348/744 |
| 2009/0219454 | A1 * | 9/2009 | Horigome et al. | ........... 348/744 |

* cited by examiner

*Primary Examiner*—Hung V Ngo
(74) *Attorney, Agent, or Firm*—Zhigang Ma

(57) ABSTRACT

A locking system for an electronic device housing comprises a top plate, a movable cover pivotal about a first edge of the top plate, and a lateral plate connected to a second edge of the top plate which is perpendicular to the first edge. The top plate defines an opening near the second edge thereof. The locking system comprises a flexible lock-receiving portion, an engaging portion, a groove, and a disengaging member. The flexible lock-receiving portion protrudes from the top plate within the opening and has a protrusion extending downwardly. The engaging portion is formed on a surface of the movable cover and faces the opening. The groove is defined on the lateral plate corresponding to the opening. The disengaging member is inside the groove and protrudes to engage the protrusion.

20 Claims, 6 Drawing Sheets

LOCKING SYSTEM FOR ELECTRONIC DEVICE HOUSING

FIELD OF THE INVENTION

The present invention relates to locking systems and, particularly, to a locking system of a housing of an electronic device.

BACKGROUND

Housings, generally used to cover and protect electronic devices, may employ a locking system to secure separable portions such as a top plate and a cover. A conventional locking system is typically complicated and utilizes numerous elements, such as springs, screws, hooks, and latches.

Therefore, it is desirable to provide a locking system of a housing which can overcome the problems described.

SUMMARY

An exemplary locking system for an electronic device housing comprises a top plate, a movable cover pivotal about a first edge of the top plate, and a lateral plate connected to a second edge of the top plate which is perpendicular to the first edge. The top plate defines an opening near the second edge thereof. The locking system comprises a flexible lock-receiving portion, an engaging portion, a groove, and a disengaging member. The flexible lock-receiving portion protrudes from the top plate within the opening and has a protrusion extending downwardly. The engaging portion is formed on a surface of the movable cover and faces the opening. The groove is defined on the lateral plate corresponding to the opening. The disengaging member is inside the groove and protrudes to engage the protrusion.

DETAILED DESCRIPTION OF EMBODIMENTS

Embodiments of a locking system for a portable electronic device housing are described in detail here with reference to the drawings.

Figure 1:
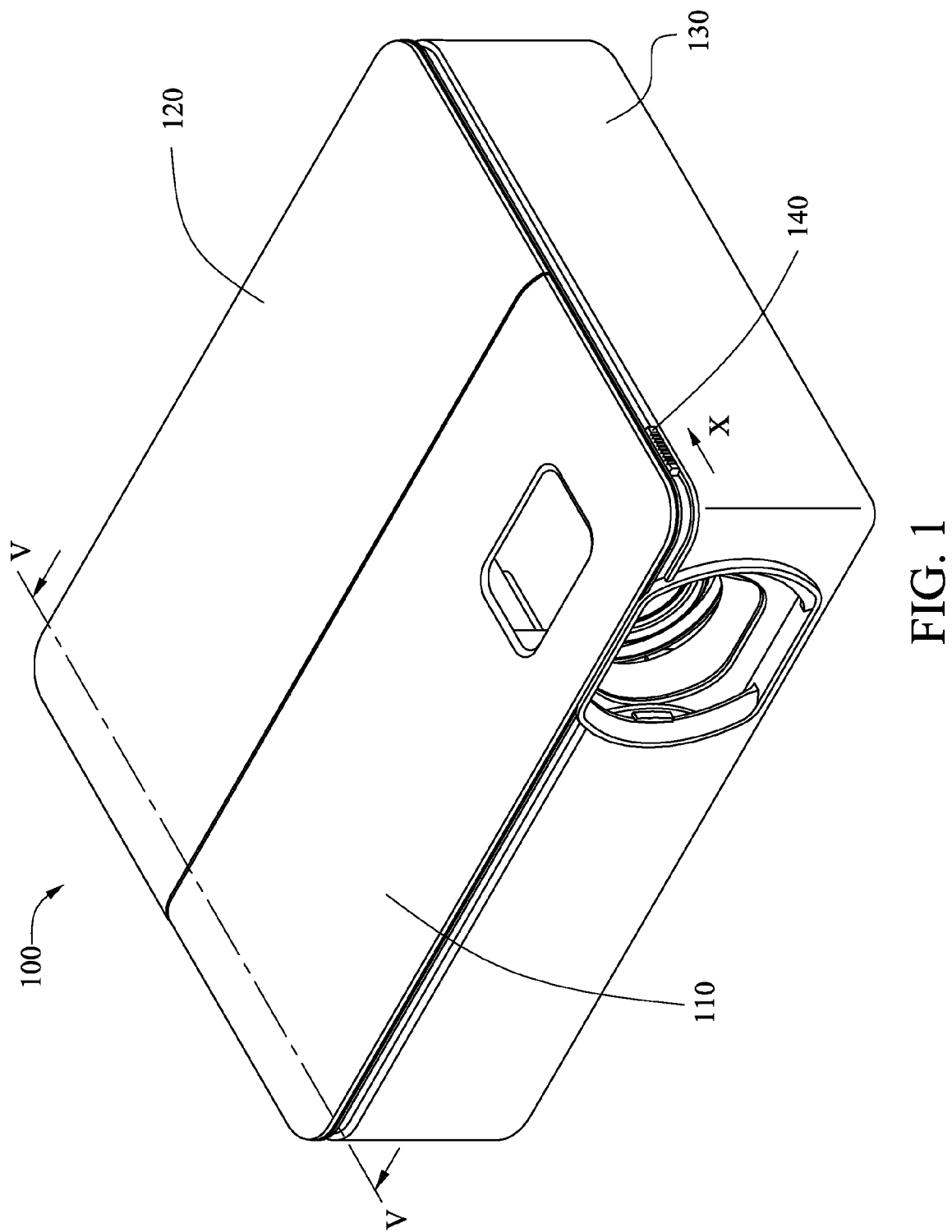
FIG. 1 is an isometric view of an electronic device housing in a closed position according to an exemplary embodiment.

FIG. 1 is an isometric view of an electronic device housing 100, according to an exemplary embodiment. The electronic device housing 100 may be a projection device, an image-capturing device, or similar device. In this embodiment, the electronic device housing 100 is a projection device housing. The electronic device housing 100 includes a movable cover 110, a fixed cover 120, a lateral plate 130, and two disengaging members 140. The movable cover 110 is adjacent to the fixed cover 120. The lateral plate 130 is perpendicular to the movable cover 110 and the fixed cover 120. The disengaging members 140 are located on an edge of the lateral plate 130 adjacent to the movable cover 110 and are capable of moving backwards in an X direction (closer to the fixed cover 120) to unlock the movable cover 110.

Figure 2:
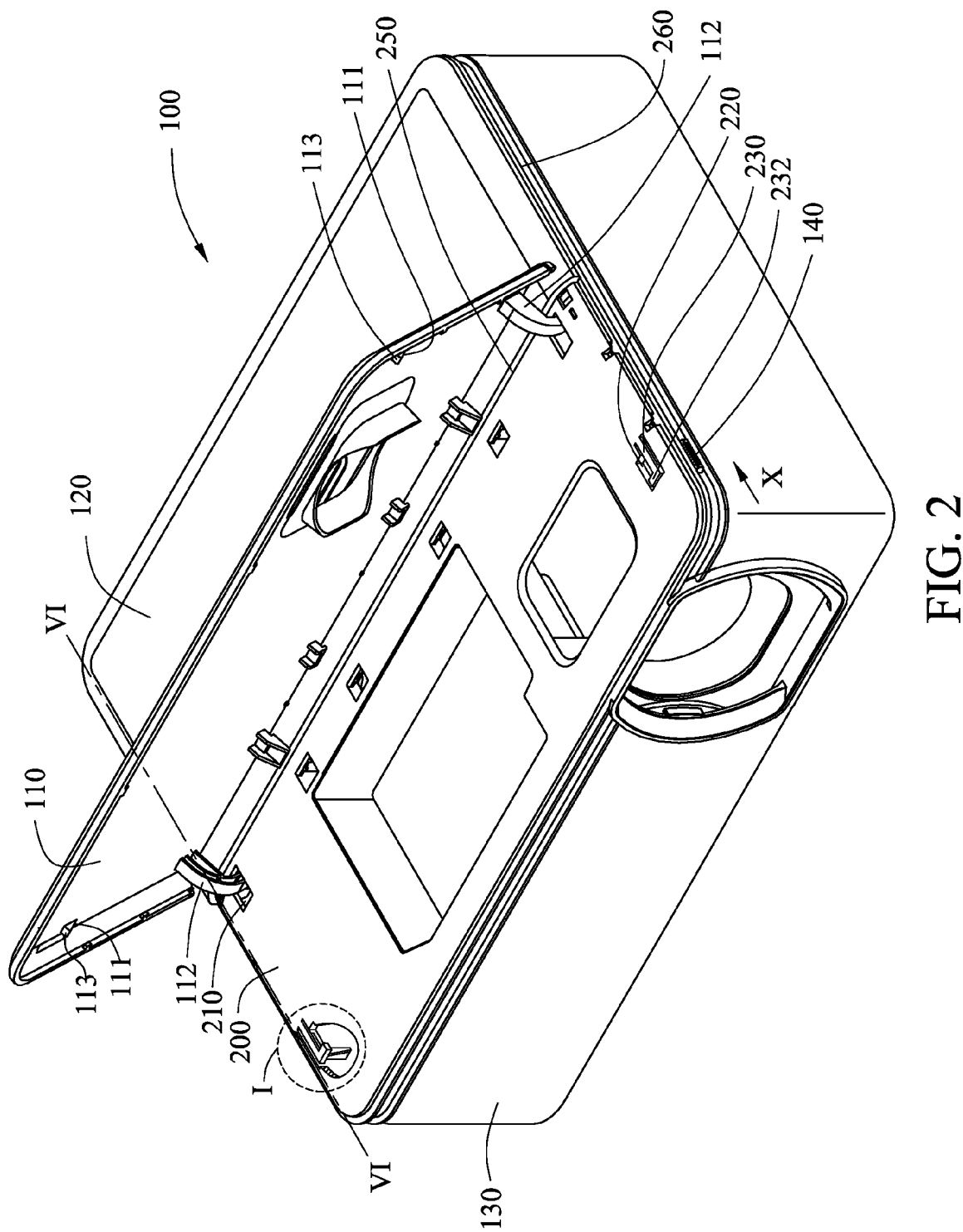
FIG. 2 is an isometric view of the electronic device housing of FIG. 1 in an open position according to the exemplary embodiment.

As shown in FIG. 2, when the movable cover 110 is lifted, a top plate 200 covering the electronic device housing 100 is exposed. The top plate 200 includes openings 210, 220, flexible lock-receiving portions 230, a first edge 250, and a second edge 260 perpendicular to the first edge 250. The flexible lock-receiving portions 230 shown within the dotted line I of FIG. 2 are enlarged in FIG. 4.

Figure 4:
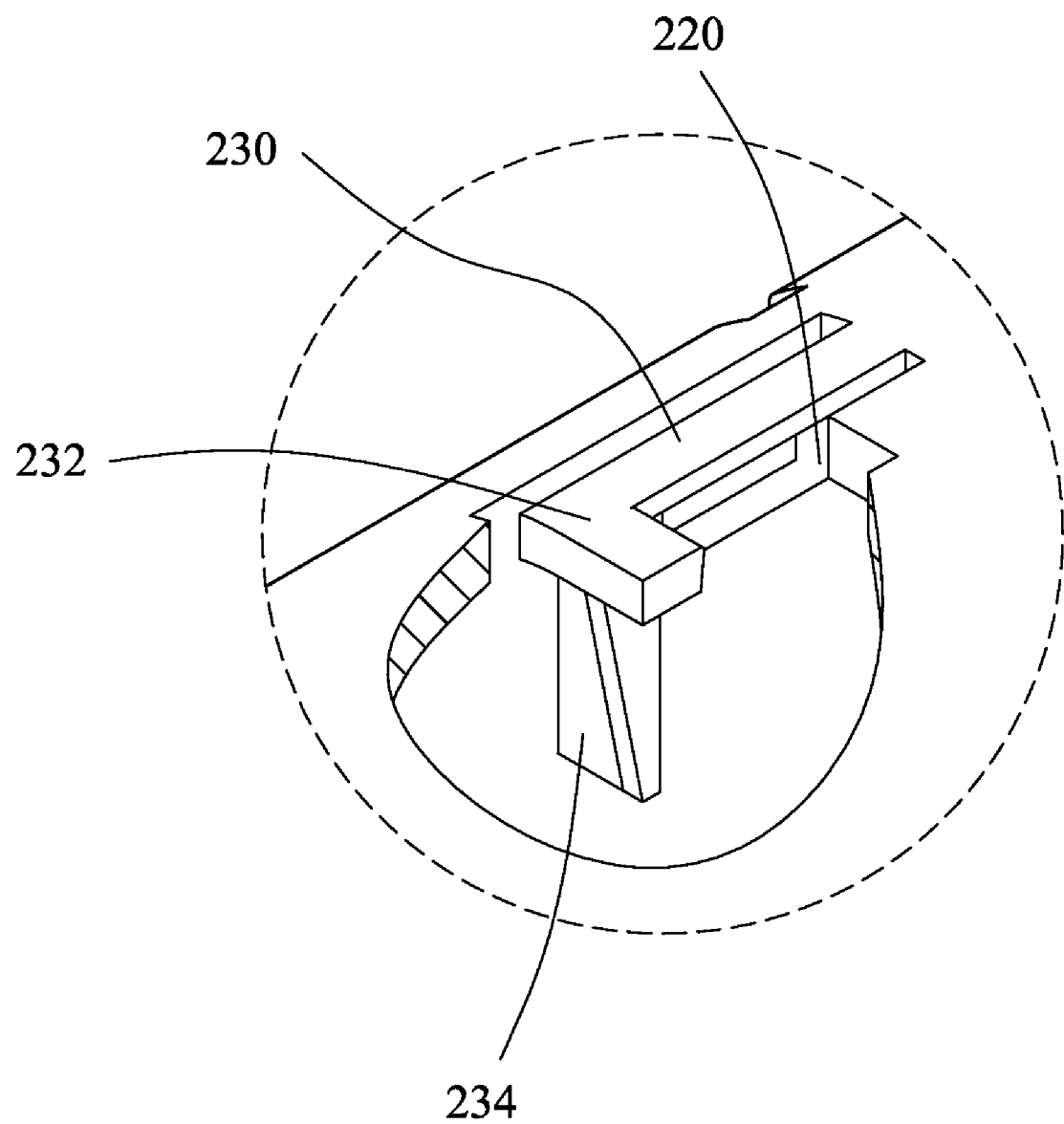
FIG. 4 is an enlarged view of a flexible lock-receiving portion shown within the dotted line I of FIG. 2.

Referring to FIGS. 2 and 4, the flexible lock-receiving portions 230 protrude from the top plate 200 within the opening 220, and include blocking surfaces 232 perpendicular to the lateral plate 130 and protrusions 234 extending downwardly opposite to the movable cover 110 to restrict movement of the disengaging members 140.

The movable cover 110 is pivotal about the first edge 250, and the lateral plate 130 is uprightly connected to the second edge 260. The movable cover 110 includes at least one engaging portion 111 and at least one support 112. In this embodiment, the movable cover 110 includes two engaging portions 111 and two supports 112. The supports 112 throughout the openings 210 near the first edge 250 connect with the movable cover 110 and the top plate 200. The engaging portions 111, on a surface of the movable cover 110 facing the openings 220, engage with the flexible lock-receiving portions 230. The engaging portions 111 include engaging surfaces 113 blocked by the blocking surfaces 232 of the lock-receiving portions 230 to lock the movable cover 110 when the movable cover 110 is moved down. In this embodiment, the engaging portions 111 are right-angle triangular, although in other embodiments, the engaging portions 111 may be rectangular.

Figure 3:
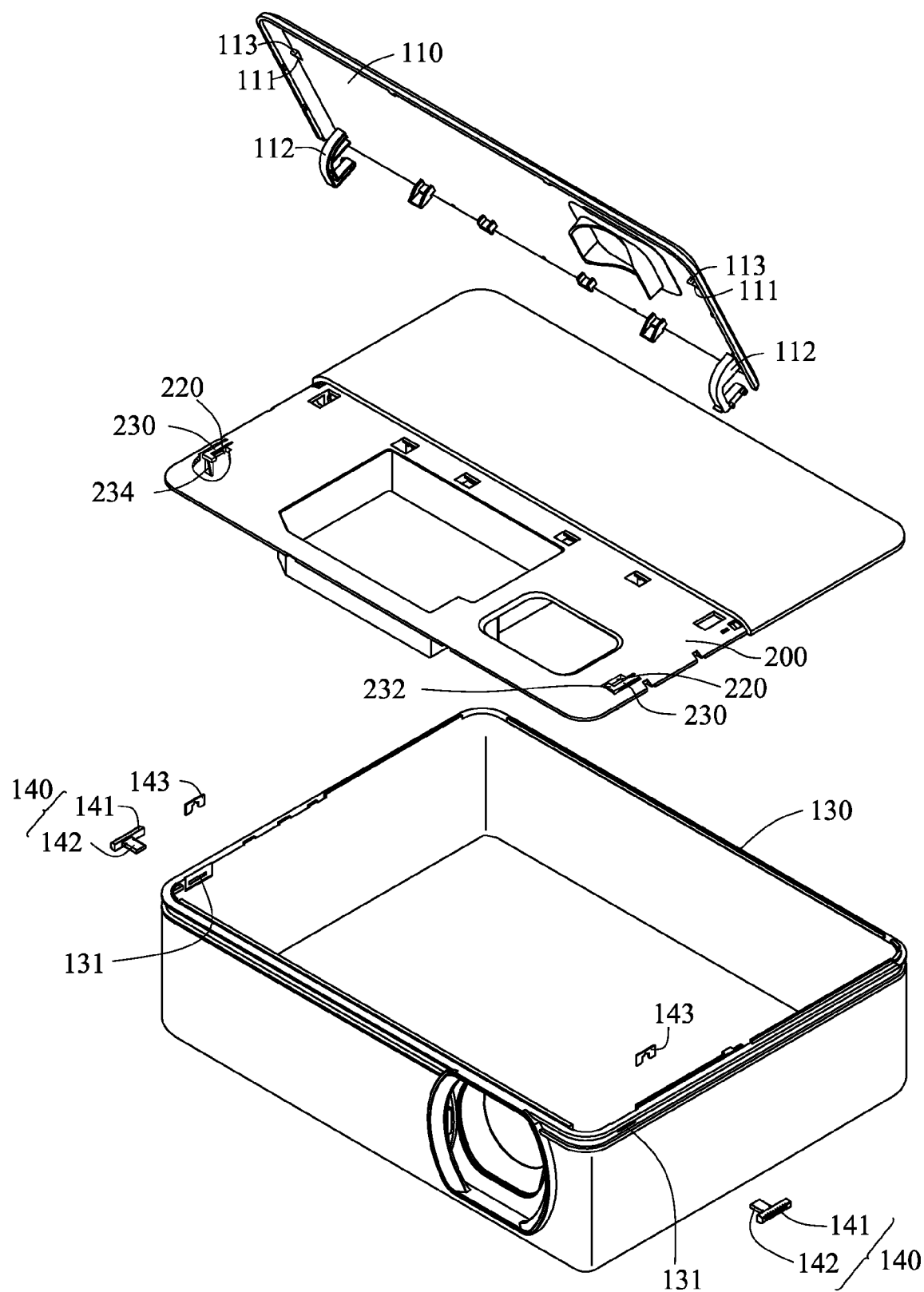
FIG. 3 is an exploded view of the electronic device housing of FIG. 1.

In FIG. 3, an exploded view of the electronic device housing 100 of FIG. 2, it can be seen that the lateral plate 130 includes grooves 131 corresponding to the openings 220. Each of the disengaging members 140 comprises an operating portion 141, and a contact portion 142 protrudes perpendicularly from the operating portion 141 such that each of the disengaging members 140 forms a T-shaped member. The disengaging members 140 are inserted in the grooves 131 with the operating portions 141 outside the lateral plate 130 to shield the grooves 131. The contact portions 142 positioned inside the grooves 131 engage with the protrusions 234 of the flexible lock-receiving portions 230. Two concave sheets 143 are provided adjacent to an inner wall of the lateral plate 130 to fix the contact portions 142 in the grooves 131. The concave sides of the concave sheets 143 face the contact portions 142 of the disengaging members 140, fixing related positions corresponding to the disengaging members 140 and the lateral plate 130. The grooves 131 are larger than the contact portions 142 such that the disengaging members 140 can slide along the grooves 131. In this embodiment, the protrusions 234 are adjacent to or contact the contact portions 142 of the disengaging members 140, and the protrusions 234 are tapered. In other embodiments, the protrusions 234 are rectangular or cylindrical.

Figure 5:
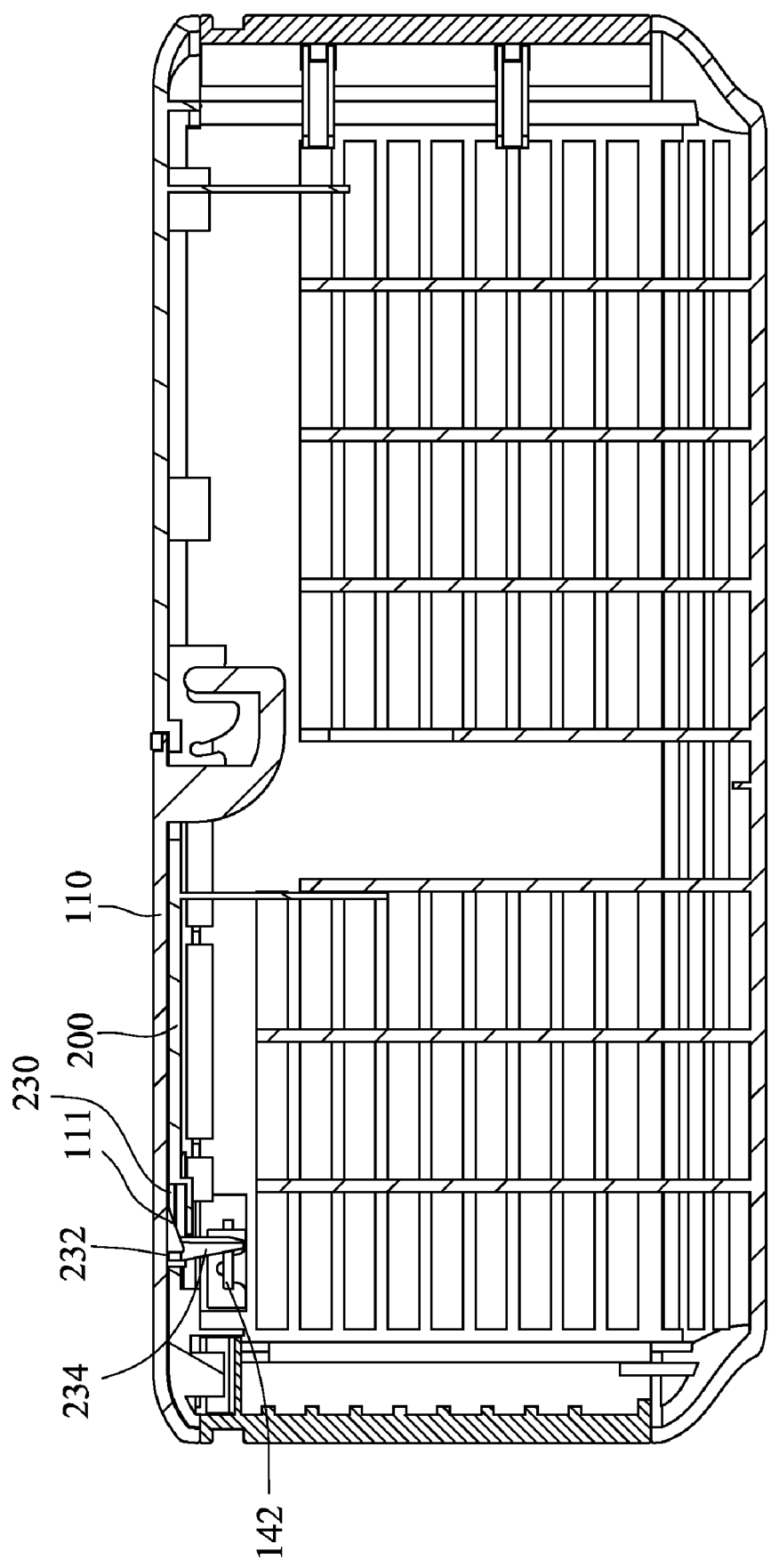
FIG. 5 is a cross-section of the electronic device housing of FIG. 1 taken along line V-V thereof.

FIG. 5 is a cross-section of the electronic device housing of FIG. 1 taken along line V-V thereof. When the movable cover 110 is closed, the engaging portions 111 contact the blocking surfaces 232 of the flexible lock-receiving portions 230, and the protrusions 234 of the flexible lock-receiving portions 230 are impelled downward to obstruct the contact portions 142 of the disengaging members 140 so that the disengaging members 140 are restricted from movement. As a result, the movable cover 110 is locked.

Figure 6:
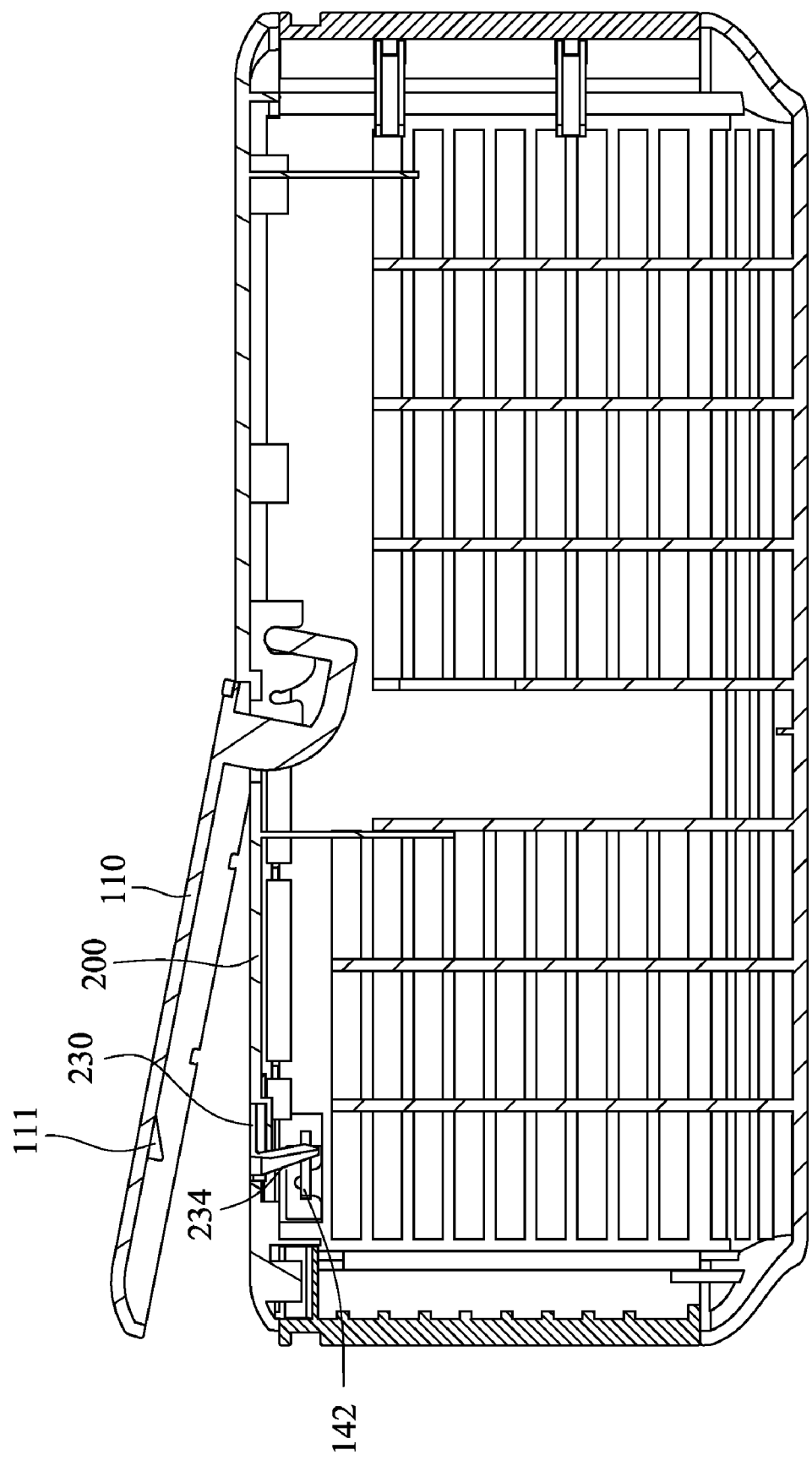
FIG. 6 is a cross-section of the electronic device housing of FIG. 2 taken along line VI-VI thereof.

FIG. 6 is a cross-section of the electronic device housing of FIG. 2 taken along line VI-VI thereof. When the disengaging members 140 are moved backwards in the X direction, the engaging portions 111 are separated from the flexible lock-receiving portions 230, and the protrusions 234 are pressed backwards in the X direction by the contact portions 142 of the disengaging members 140. Thus, a position of the flexible lock-receiving portions 230 to a position of the top plate 200 about a specific angle, determined by the force of the disengaging members 140. As a result, the movable cover 110 is unlocked.

Compared with conventional solutions, the above-described locking system of the electronic device housing provides easy locking of the electronic device housing and decreases costs, thereby enhancing yields.

It will be understood that the above particular embodiments are described and shown in the drawings by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. A locking system for an electronic device housing, the electronic device housing comprising a top plate, a movable cover pivotal about a first edge of the top plate, and a lateral plate connected to a second edge of the top plate which is perpendicular to the first edge, the top plate comprising an opening defined near the second edge thereof, the locking system comprising:
   a flexible lock-receiving portion protruding from the top plate within the opening and comprising a protrusion extending downwardly;
   an engaging portion on a surface of the movable cover and facing the opening, the engaging portion capable of engaging with the flexible lock-receiving portion;
   a groove on the lateral plate corresponding to the opening; and
   a disengaging member inside the groove and protruding to engage with the protrusion.

2. The locking system of claim 1, wherein the flexible lock-receiving portion comprises a blocking surface perpendicular to the lateral plate.

3. The locking system of claim 2, wherein the engaging portion comprises an engaging surface capable of engaging with the blocking surface to lock the movable cover when the movable cover is moved down to the engaging surface.

4. The locking system of claim 1, wherein the disengaging member comprises an operating portion and a contact portion protruding perpendicularly from the operating portion.

5. The locking system of claim 4, wherein the groove is larger than the contact portion.

6. The locking system of claim 4, wherein the engaging portion contacts the flexible lock-receiving portion and the protrusion of the flexible lock-receiving portion blocks the contact portion of the disengaging member from moving when the movable cover is closed.

7. The locking system of claim 4, wherein the engaging portion is separated from the flexible lock-receiving portion and the protrusion is moved in a specific direction by the contact portion when the disengaging member is moved backwards to the specific direction.

8. The locking system of claim 1, wherein the operating portion is positioned outside the lateral plate to shield the groove.

9. The locking system of claim 1, wherein the engaging portion is right-angled triangular or rectangular.

10. The locking system of claim 1, wherein the protrusion is rectangular, cylindrical, or tapered.

11. The locking system of claim 1, wherein the disengaging member is T-shaped.

12. An electronic device housing comprising:
    a top plate including a first edge and a second edge;
    a movable cover pivotal about the first edge of the top plate;
    a lateral plate connected to the second edge of the top plate, the top plate having an opening defined near the second edge thereof; and
    a locking system, comprising:
    a flexible lock-receiving portion protruding from the top plate within the opening and comprising a protrusion extending downwardly;
    an engaging portion on a surface of the movable cover and facing the opening, the engaging portion capable of engaging with the flexible lock-receiving portion;
    a groove defined on the lateral plate corresponding to the opening; and
    a disengaging member inside the groove and protruding to engage with the protrusion.

13. The electronic device housing of claim 12, wherein the flexible lock-receiving portion comprises a blocking surface perpendicular to the lateral plate.

14. The electronic device housing of claim 13, wherein the engaging portion comprises an engaging surface capable of engaging with the blocking surface to lock the movable cover when the movable cover is moved down to the engaging surface.

15. The electronic device housing of claim 12, wherein the disengaging member comprises an operating portion and a contact portion protruding perpendicularly from the operating portion to form a T-shaped member.

16. The electronic device housing of claim 15, wherein the groove is larger than the contact portion.

17. The electronic device housing of claim 15, wherein the engaging portion contacts the protrusion of the flexible lock-receiving portion when the movable cover is closed.

18. The electronic device housing of claim 15, wherein the engaging portion is separated from the flexible lock-receiving portion and the protrusion is moved in a specific direction by the contact portion when the disengaging member is moved backwards towards the specific direction.

19. The electronic device housing of claim 12, wherein the engaging portion is right-angle triangular or rectangular.

20. The electronic device housing of claim 12, wherein the protrusion is rectangular, cylindrical, or tapered.

* * * * *